US007016386B2

(12) United States Patent
Kitamura (10) Patent No.: US 7,016,386 B2
(45) Date of Patent: Mar. 21, 2006

(54) SEMICONDUCTOR LASER DEVICE (75) Inventor: Tomoyuki Kitamura, Kanagawa (JP)

(73) Assignee: Sony Corporation, (JP)

( * ) Notice: Subject to any disclaimer, the term of this patent is extended or adjusted under 35 U.S.C. 154(b) by 127 days.

(21) Appl. No.: 10/446,184

(22) Filed: May 28, 2003

(65) Prior Publication Data
US 2004/0047379 A1  Mar. 11, 2004

(30) Foreign Application Priority Data
May 29, 2002  (JP)  ............................ P2002-155508

(51) Int. Cl.
H01S 5/00 (2006.01)
(52) U.S. Cl. .......................................... 372/46; 372/45
(58) Field of Classification Search ............. 372/45–46
See application file for complete search history.

(56) References Cited

U.S. PATENT DOCUMENTS 5,838,028 A * 11/1998 Horie et al. ................. 257/183
5,960,019 A * 9/1999 Hayashi et al. ............... 372/46
2001/0017872 A1 * 8/2001 Yamanaka .................... 372/43

* cited by examiner

Primary Examiner—MinSun Oh Harvey
Assistant Examiner—James Menefee
(74) Attorney, Agent, or Firm—Rader, Fishman & Grauer PLLC; Ronald P. Kananen (57) ABSTRACT A broad area semiconductor laser device is provided having an NFP with top hat shaped profiles for the P wave and the S wave, which result from polarized beam splitting of the emitted light. The broad area semiconductor laser device of the present invention has the same structure as the broad area semiconductor laser device of the prior art, except that the composition of an etch stop layer is different. The semiconductor laser device includes an n-$Al_{0.5}Ga_{0.5}As$ first clad layer, an active layer including an AlGaAs optical guide layer and an AlGaAs quantum well layer, a 0.3 μm thick p-$Al_{0.5}G_{0.5}As$ lower second clad layer, an $Al_{0.7}Ga_{0.3}As$ etch stop layer, a p-$Al_{0.5}Ga_{0.5}As$ upper second clad layer, and a p-GaAs contact layer, which form a laminated structure on top of an n-GaAs substrate.

8 Claims, 6 Drawing Sheets

P WAVE

FIG.2B

S WAVE

P WAVE

FIG.4B

S WAVE

RELATED ART

P WAVE

FIG.6B
RELATED ART

S WAVE

SEMICONDUCTOR LASER DEVICE

CROSS REFERENCE TO RELATED APPLICATIONS

The present document claims priority to Japanese Priority Document JP 2002-155508, filed in the Japanese Patent Office on May 29, 2002, the entire contents of which are incorporated herein by reference to the extent permitted by law.

BACKGROUND OF THE INVENTION

1. Field of the Invention

The present invention relates to a broad area semiconductor laser device, and more specifically to a broad area, high power semiconductor laser device that is suitable for, for example, an optical source in a device for initializing an optical disk, a pump laser in an optical amplifier, or an optical source in a laser machining tool.

2. Description of Related Art

High power semiconductor laser devices, which radiate a high power laser beam, with an output level of, for example, 300 mW or greater, are gaining attention as semiconductor light emitting devices for optical sources in, for example, a laser machining tool, a device for initializing an optical disk, a laser printer, or as a pump laser in an optical amplifier.

A characteristic required of a high power semiconductor laser device that is used as an optical source in the applications mentioned above is uniformity in a near field pattern (NFP) optical intensity. If the NFP optical intensity distribution were not uniform, and an NFP profile were to include bright and dark areas with significant contrast differences, large ripples, or significant differences in the maximum and minimum optical intensity levels, then the semiconductor laser device would cause a printing non-uniformity, for example, in a laser printer, or a non-uniform initialization on the optical disk. Ideally, the semiconductor laser device should offer a uniform optical intensity distribution in the direction of the width of a laser stripe part in the NFP profile.

The non-uniformity in the NFP becomes noticeable when the broad area semiconductor laser device has a laser stripe part width that is greater than or equal to 20 µm. Japanese Patent Application Publication 2001-230493 describes a semiconductor laser device that has a uniform optical intensity distribution of the NFP profile in the direction of the width of the laser stripe part. In order to make the optical intensity of the NFP profile uniform in the broad area semiconductor laser device, a film thickness of a clad layer outside of a current injection region should be less than or equal to 0.7 µm.

Figure 5:
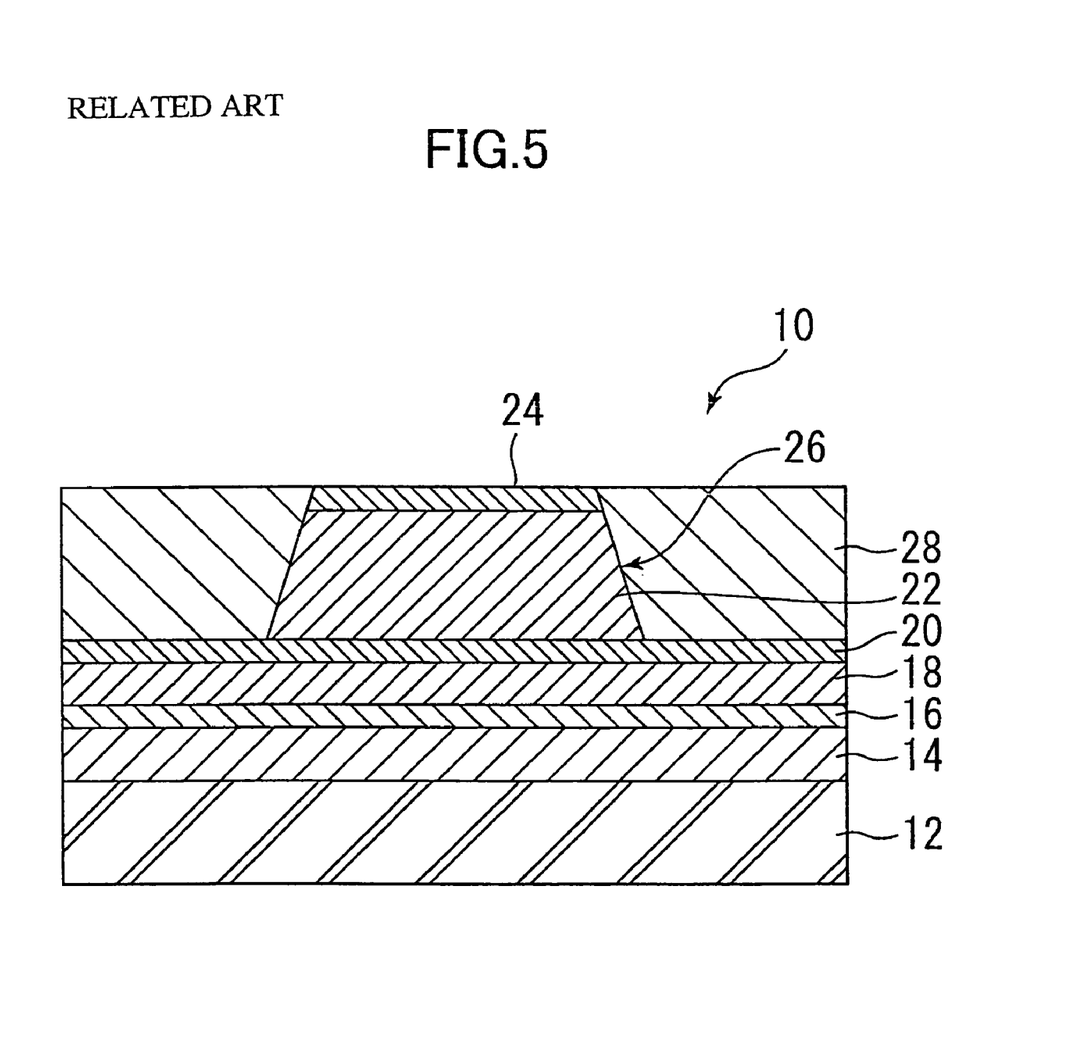
FIG. 5 is a cross-sectional view that shows the structure of the semiconductor laser device of the prior art.

A structure of a broad area AlGaAs semiconductor laser device of a prior art, which incorporates the invention described in Japanese Patent Application Publication 2001-230493, will be described by referring to FIG. 5. FIG. 5 shows a cross-sectional view of a structure of the broad area AlGaAs semiconductor laser device.

As shown in FIG. 5, a broad area GaAs semiconductor laser device 10 includes a laminated structure consisting of a n-$Al_{0.5}Ga_{0.5}As$ first clad layer 14 an active layer 16 consisting of an $Al_xGa_{1-x}As$ optical guide layer and an $Al_yGa_{1-y}As$ quantum well layer, where x>y, a p-$Al_{0.5}Ga_{0.5}As$ lower second clad layer 18 that has a film thickness of less than or equal to 0.7 µm or, for example, a film thickness of 0.3 µm, a GaInP etch stop layer 20, a p-$Al_{0.5}Ga_{0.5}As$ upper second clad layer 22, and a p-GaAs contact layer 24, all of which are formed on top of a n-GaAs substrate 12.

The p-$AL_{0.5}GA_{0.5}As$ upper second clad layer 22 and the p-GaAs contact layer 24 are etched down to the GaInP etch stop layer 20 and are formed into a ridge 26, which is in a shape of a ridge. The GaInP etch stop layer 20 is exposed on the sides of the ridge 26.

An n-GaAs layer 28 is formed in such a way as to bury the ridge 26 and the GaInP etch stop layer 20, which is exposed on the sides of the ridge. The n-GaAs layer 28 forms a current non-injection region with a pn junction isolation. Although not shown in this figure, a p side electrode is formed on top of the p-GaAs contact layer 24, and an n side electrode is formed on the back side of the n-GaAs substrate 12.

In, for example, a device for initializing an optical disk, a semiconductor laser device that functions as an optical source radiates a laser beam onto an optical disk in order to initialize the optical disk. A laser beam reflecting back from the optical disk can destabilize the output from the semiconductor laser device or degrade the semiconductor laser device. Therefore, the back reflection must be shielded.

To address this issue, a polarized beam splitter (PBS) is placed between the semiconductor laser device and the optical disk for redirecting the back reflection from the optical disk by a 90° angle and for splitting the laser beam that is emitted from the semiconductor laser device into the PBS into a P wave (a p polarized component) and a S wave (an s polarized component). While the P wave is allowed to travel straight, the S wave is deflected by 90° with respect to the incoming angle, so that the P wave, which has a high optical intensity, will radiate on the optical disk. While the P wave is an optical component that is polarized in the direction of the compound semiconductor layers that make up the semiconductor laser device, the S wave is an optical component that is polarized in a direction normal to the compound semiconductor layers in the semiconductor laser device.

Furthermore, the semiconductor laser device that is used as the optical source in the device for initializing the optical disk must offer flat profiles or top hat shaped profiles, for both the P wave and the S wave. Here, a flat or a top hat shaped profile refers to a profile with the same optical intensity levels at the various coordinate points in the direction of the width of the laser stripe part. Furthermore, assuming that the average value for the optical intensity levels at the various coordinate points in the direction of the width of the laser stripe part is A for the P wave (refer to FIG. 6A) and the maximum value for the optical intensity levels at the various coordinate points along the width of the laser stripe part for the S wave is B (refer to FIG. 6B), it is required that (B/A)×100 be 13% or smaller.

SUMMARY OF THE INVENTION

Figure 6A:
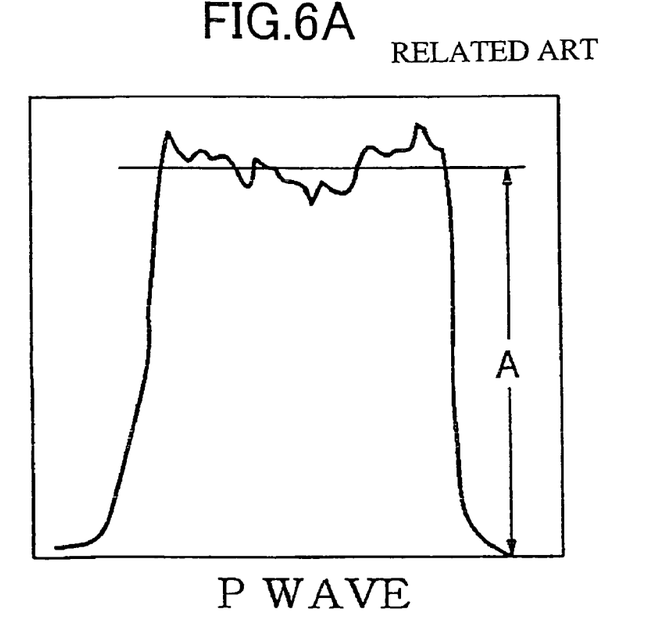
FIG. 6A and FIG. 6B show profiles of the P wave and the S wave, respectively, from the semiconductor laser device of the prior art.
Figure 6B:
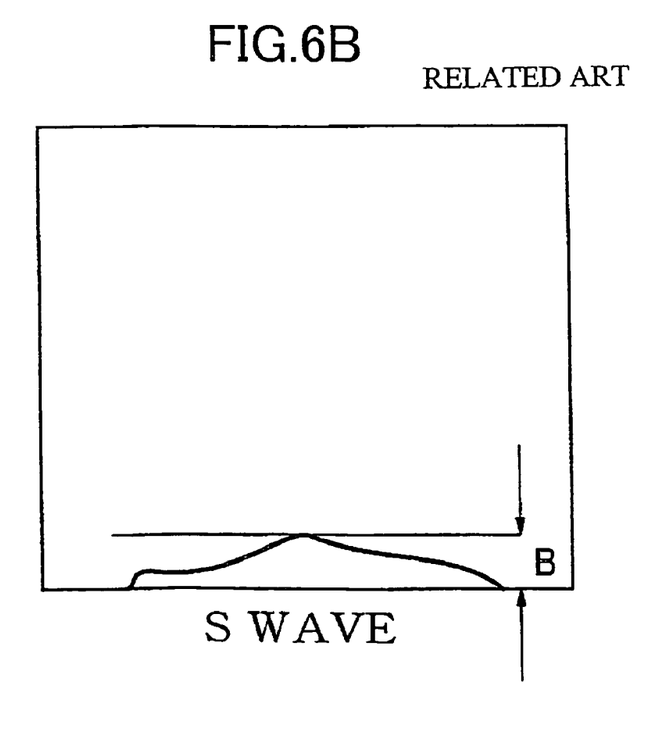

In the broad area semiconductor laser device of the prior art described above, however, the optical intensity levels of the P wave and the S wave have an intensity distribution in the direction of the width of the laser stripe part and do not show flat or top hat shaped profiles as shown in FIGS. 6A and 6B. Furthermore, the value for (B/A)×100 ranges from 10% to 20% and varies greatly.

FIG. 6A and FIG. 6B show graphs that plot the optical intensity levels at various coordinate points in the direction of the width of the emission edge surface of the laser stripe part. While the horizontal axis represents the coordinate points, the vertical points represent the optical intensity levels.

With the results shown in FIG. 6A and FIG. 6B, it would be difficult to satisfy the requirements that were described earlier for the semiconductor laser device that is used as the optical source in the device for initializing the optical disk.

In order to address the issue described above, the present invention provides a broad area, high power semiconductor laser device that has an NFP with top hat shaped profiles for both the P wave and the S wave, which are optical components that would result from a polarization beam splitting.

In pursuing factors that cause the P wave and the S wave in the broad area semiconductor laser device of the prior art to not have top hat shaped profiles, the present inventors have discovered that stress in the GaInP etch stop layer would cause non-uniformity in the distribution of the polarized beams in a light emitting area. As a result, the P wave and the S wave would do not exhibit top hat shaped profiles.

Furthermore, the inventors also discovered that the stress in the GaInP etch stop layer is caused by a lattice mismatch between the GaInP etch stop layer and the p-$AL_{0.5}Ga_{0.5}As$ lower second clad layer 18 as well as the p-$AL_{0.5}Ga_{0.5}As$ upper second clad layer 22.

The inventors decided to use for the etch stop layer a compound semiconductor layer that has a composition that would lead to a smaller lattice mismatch with respect to the p-$AL_{0.5}Ga_{0.5}As$ lower second clad layer 18 and the p-$AL_{0.5}Ga_{0.5}As$ upper second clad layer 22. The inventors experimented with various types of compound semiconductor layers. As a result, the present invention has been made after verifying experimentally that an $Al_xGa_{1-x}As$ ($0.4 \leq x \leq 0.8$) layer, when used as the etch stop layer, satisfies this requirement.

A semiconductor laser device of the present invention, which is based on the above mentioned discovery, is a broad area type AlGaAs semiconductor laser device of a multi-layered structure that at least includes a first clad layer of a first conductance type, an active layer consisting of an optical guide layer and a quantum well layer, a lower second clad layer of a second conductance type, a compound semiconductor layer that has a composition that is different from the lower second clad layer (hereunder referred to as the specific compound semiconductor layer) and an upper second clad layer of the same composition as the lower second clad layer all of which are deposited on top of each other on a substrate. Furthermore, the semiconductor laser device of the present invention is a broad area AlGaAs semiconductor laser device, in which the upper second clad layer is formed into a stripe shaped ridge, which has a width of greater than or equal to 20 μm and functions as a current injection region; the specific compound semiconductor layer has a composition of $Al_xGa_{1-x}As$ (0.4×0.8) and functions as an etch stop layer, as the upper second clad layer is etched.

In the present invention, the specific compound semiconductor layer has a composition of $Al_xGa_{1-x}As$ ($0.4 \leq x \leq 0.8$), which is not significantly different from the composition of the upper and the lower second clad layers. For this reason, the specific compound semiconductor layer would not be susceptible to a strain that would lead to a stress. As a result, the profiles for the P wave and the S wave would be top hat shaped.

Furthermore, because the specific compound semiconductor layer functions as the etch stop layer, the upper second clad layer can be easily formed into a ridge.

In the preferred embodiment of the present invention, the composition of the lower second clad layer is $Al_yGa_{1-y}As$, and the composition of the specific compound semiconductor layer is $Al_xGa_{1-x}As$, where x>y.

As a result, the specific compound semiconductor layer would function effectively as the etch stop layer.

Furthermore, because the film thickness of the lower second clad layer is less than or equal to 0.7 μm, the film thickness of the second clad layer that exists in the current non-injection region would be less than or equal to 0.7 μm. As a result, currents would get injected efficiently into the current injection region, as described in Japanese Patent Application Publication 2001-230493. Furthermore, the light would be sealed efficiently in an area directly below the stripe shaped ridge because of a difference in the optical absorption losses between the current injection region and the current non-injection region, and a stable NFP would be achieved without flickering in the bright areas and the dark areas of the NFP.

Furthermore, the stripe shaped ridge may be formed into an air ridge, or the specific compound semiconductor layer on the side walls of the ridge and in the adjacent areas may be covered by a compound semiconductor layer of the first conductivity type, which would be deposited by a selective deposition method.

DESCRIPTION OF THE PREFERRED EMBODIMENTS

Preferred embodiments of the present invention will be described in detail next by referring to the drawings. By the way, the conduction types, the film types, the film thickness, the deposition methods, and the dimensions that are mentioned in the embodiments are for facilitating an understanding of the present invention, and the present invention is not limited to such examples.

First Embodiment

Figure 1:
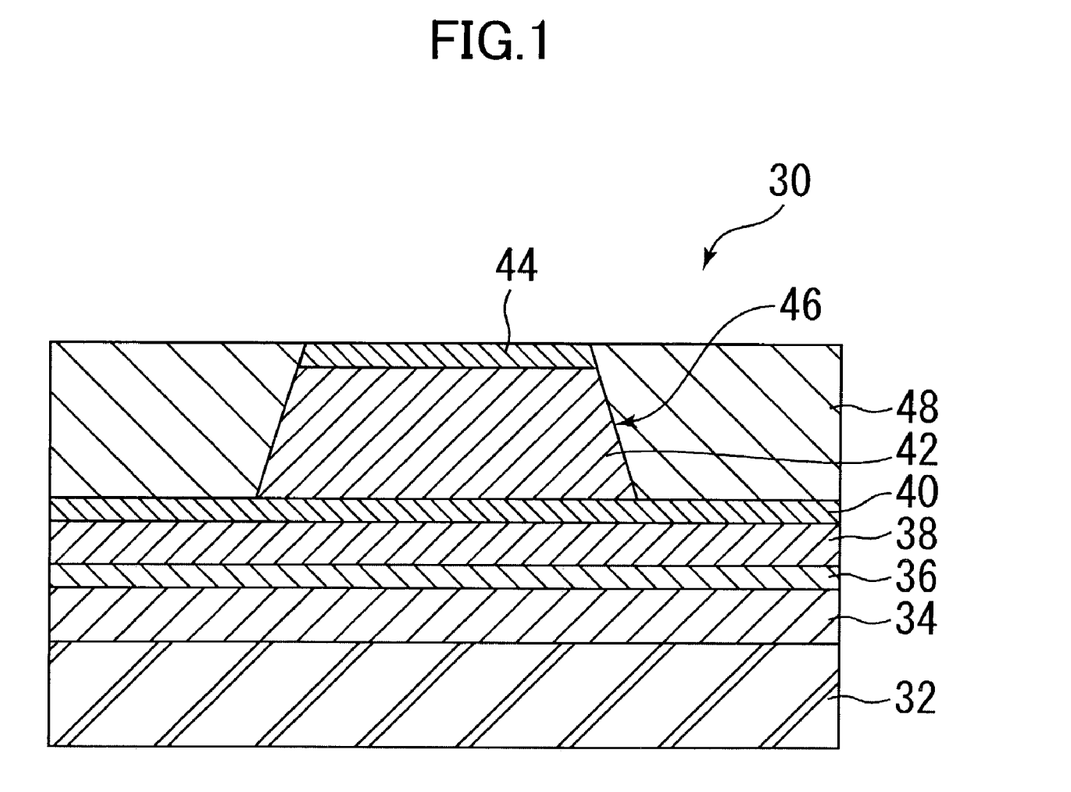
FIG. 1 is a cross-sectional view that shows a structure of a semiconductor laser device of the first embodiment.
Figure 2A:
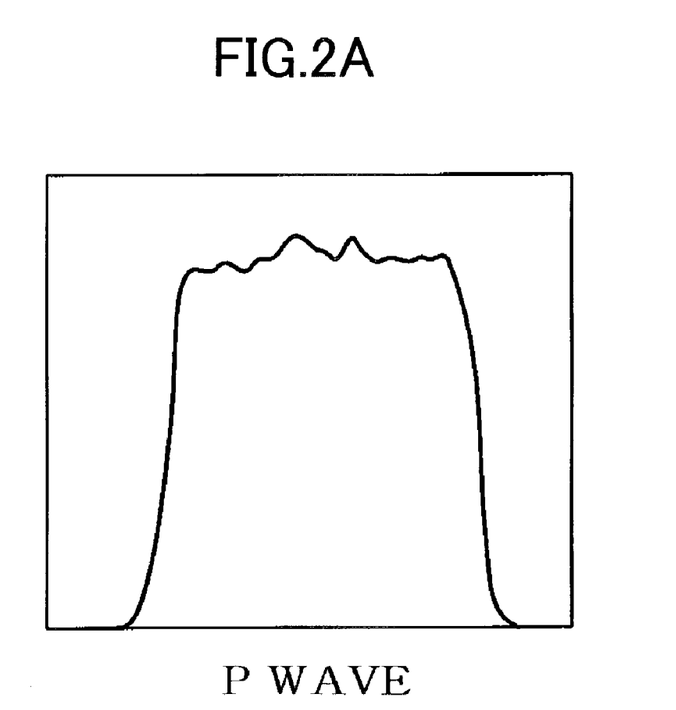
FIG. 2A and FIG. 2B show, respectively, the profiles of a P wave and an S wave from the semiconductor laser device of the first embodiment.
Figure 2B:
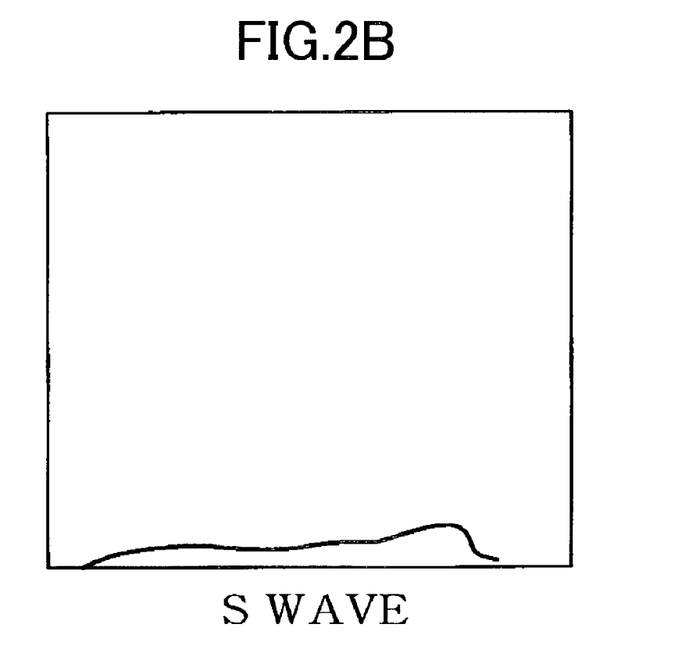

The present embodiment represents an example of the semiconductor laser device of the present invention. FIG. 1 is a cross-sectional view that shows the structure of the semiconductor laser device of the present embodiment, while FIG. 2A and FIG. 2B show the profiles for the P wave and S wave, respectively, from the semiconductor laser device of the present embodiment.

A broad area semiconductor laser device 30 of the present embodiment has the same structure as the broad area semiconductor laser device 10 of the prior art, except for a different composition for the etch stop layer.

In other words, the semiconductor laser device 30, as shown in FIG. 1, includes a 2 µm thick n-$Al_{0.5}Ga_{0.5}As$ first clad layer 34, a 30 nm thick active layer 36, which consists of an $Al_{0.3}Ga_{0.7}As$ optical guide layer and an $Al_{0.1}Ga_{0.9}As$ quantum well layer, a 0.3 µm thick p-$Al_{0.5}Ga_{0.5}As$ lower second clad layer 38, a 15 nm thick $Al_{0.7}Ga_{0.3}As$ etch stop layer 40, a 2 µm thick p-$Al_{0.5}Ga_{0.5}As$ upper second clad layer 42, and a 0.5 µm thick p-GaAs contact layer 44, all of which form a laminated structure on top of an n-GaAs substrate 32.

The p-$Al_{0.5}Ga_{0.5}As$ upper second clad layer 42 and the p-GaAs contact layer 44 are etched down to the $Al_{0.7}Ga_{0.3}As$ etch stop layer 40 and are shaped into a stripe shaped ridge 46. The $Al_{0.7}Ga_{0.3}As$ etch stop layer 40 is exposed on the sides of the ridge 46.

Furthermore, a n-GaAs layer 48 is formed in such a way as to embed the ridge 46 and the $Al_{0.7}Ga_{0.3}As$ etch stop layer 40, which is exposed on the sides of the ridge, in order to form a current non-injection region with a pn junction isolation.

Although not shown in the figure, a p side electrode is formed on top of the p-GaAs contact layer 44 and the n-GaAs layer 48, while an n side electrode is formed on the back side of the n-GaAs substrate 32.

The semiconductor laser device 30 is manufactured, firstly, by creating a laminated structure consisting of the n-$Al_{0.5}Ga_{0.5}As$ first clad layer 34, the active layer 36, which consists of the $Al_{0.3}Ga_{0.7}As$ optical guide layer and the $Al_{0.1}Ga_{0.9}As$ quantum well layer, the p-$Al_{0.5}Ga_{0.5}As$ lower second clad layer 38, the $Al_{0.7}Ga_{0.3}As$ etch stop layer 40, the p-$Al_{0.5}Ga_{0.5}As$ upper second clad layer 42, and the p-GaAs contact layer 44, which are epitaxially grown on top of each other by the MOCVD method on top of the n-GaAs substrate 32.

Next, an $SiO_2$ mask having a pattern that covers a 20 µm wide, stripe shaped current injection region and keeps the current non-injection region exposed is formed on top of the p-GaAs contact layer 44 using a lithography process.

Next, the p-GaAs contact layer 44 and the p-$Al_{0.5}Ga_{0.5}As$ upper second clad layer 42 in the current non-injection region are etched by a chemical etching method that relies on a mixture of citric acid and hydrogen peroxide as the etchant in order to expose the $Al_{0.7}Ga_{0.3}As$ etch stop layer 40 and form a stripe shaped ridge 46. This chemical etching process can be easily accomplished by selecting an appropriate ratio of citric acid and hydrogen peroxide in the etching solution mixture.

Next, the $SiO_2$ mask that was used for etching remains and is used as a mask for selective growth in order to epitaxially grow an n-GaAs layer on top of the exposed $Al_{0.7}Ga_{0.3}As$ etch stop layer 40 and to embed the ridge 46. As a result, a laser stripe part 46, which is assigned the same reference numeral as the ridge for purposes of convenience, is formed.

Next, a p side electrode is formed on top of the p-GaAs contact layer 44 and the n-GaAs layer 48, and an n side electrode is formed on the back side of the n-GaAs substrate 32.

Manufacturing of the semiconductor laser device 30 is thus completed.

Using the PBS, the NFP profile of the semiconductor laser 30 is split into the P wave and the S wave. The optical intensity levels that are measured in the direction of the width of the laser stripe part 46 yield the profiles shown in FIG. 2A and FIG. 2B. The x axis in FIG. 2A and FIG. 2B represent the coordinate for the points along the width of the emission surface of the laser stripe part 46, while the y axis represents the optical intensity level at each coordinate point.

In the present embodiment, the thickness of the second clad layer in the current non-injection region is 0.3 µm, and the composition of the etch stop layer is $Al_{0.7}Ga_{0.3}As$, so that the P wave and the S wave will show the profiles shown in FIG. 2A and FIG. 2B, which are top hat shaped or flat shaped, in the direction of the width of the laser stripe part 46. In other words, the optical intensity of the light emitting from the laser stripe part 46 is fairly uniform in the direction of the width of the laser stripe part 46.

Furthermore, the ratio (B/A)×100, where A is the average optical intensity level for the P wave and B is the maximum optical intensity level for the S wave, should preferably be 13% or greater. In the broad area semiconductor laser device 10 of the prior art, the ratio (B/A)×100 was varied between 10% and 20%. In the present embodiment, on the other hand, the ratio (B/A)×100 ranges from 8% to 12%.

Furthermore, because the thickness of the p-$Al_{0.5}Ga_{0.5}As$ lower second clad layer is less than or equal to 0.7 µm, the thickness of the second clad layer (p-$Al_{0.5}Ga_{0.5}As$ lower second clad layer 38) in the current non-injection region is less than or equal to 0.7 µm. As a result, currents are efficiently injected into the current injection region, as described in Japanese Patent Application Publication 2001-230493, and light is efficiently trapped in an area directly beneath the stripe shaped ridge 46 due to a difference in the optical absorption losses between the current injection region and the current non-injection region. Consequently, a stable NFP is obtained, without flickering in the bright parts and the dark parts of the NFP, and the optical intensity distribution in the NFP profile becomes uniform.

Furthermore, in the present embodiment, the ridge 46 is embedded using a selective deposition method, and then the $SiO_2$ mask is stripped off to expose the p-GaAs contact layer 44, and the p side electrode is formed.

On the other hand, another approach is also possible, where the n-GaAs layer 48 would be epitaxially grown over the entire substrate after the ridge 46 has been formed, and then an opening would be etched in the n-GaAs layer 48 on top of the p-GaAs contact layer 44 in order to form the p side electrode. With this approach, the n-GaAs layer 48 would cover the edges of the p-GaAs contact layer 44, and, as a result, the P wave and the S wave would no longer exhibit flat profiles.

Second Embodiment

Figure 3:
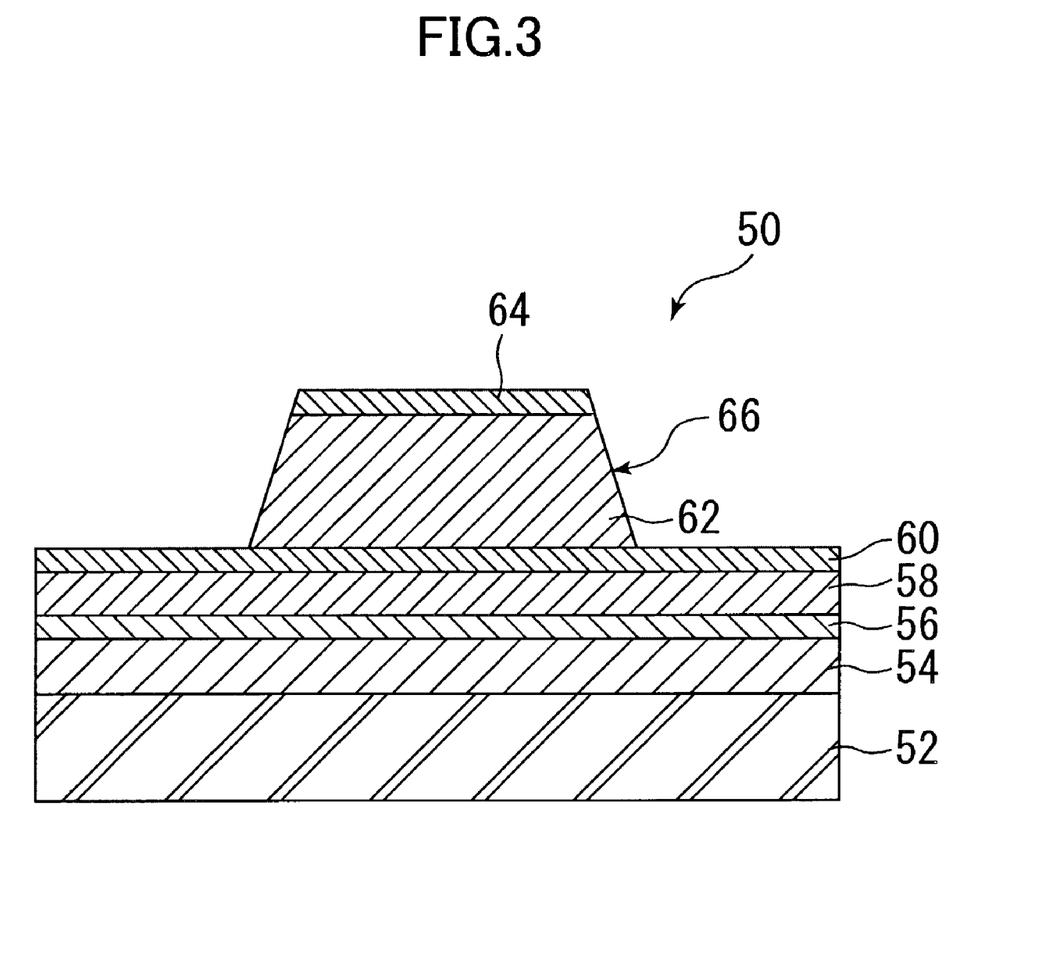
FIG. 3 is a cross-sectional view that shows a structure of a semiconductor laser device of the second embodiment.
Figure 4A:
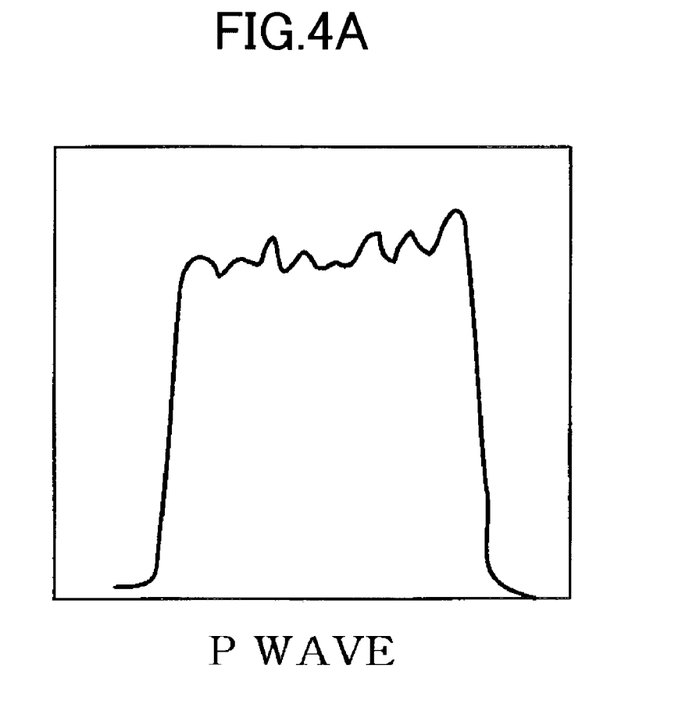
FIG. 4A and FIG. 4B show profiles of the P wave and the S wave, respectively, from the semiconductor laser device of the second embodiment.
Figure 4B:
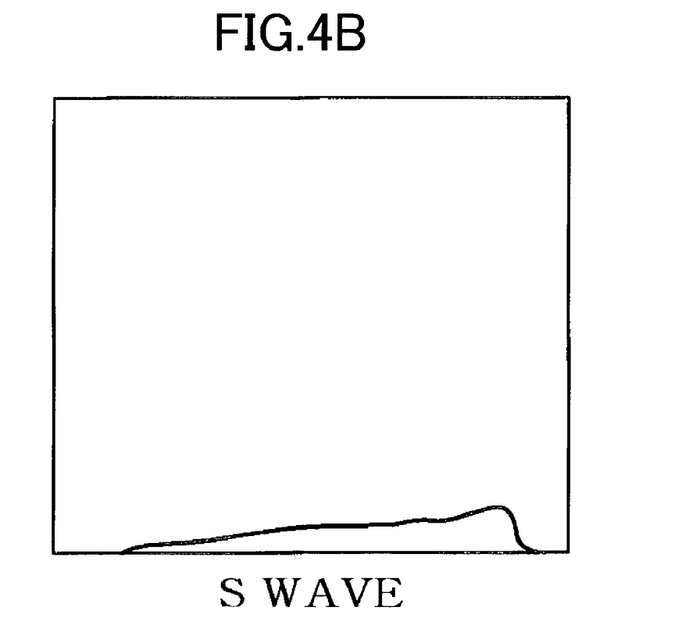

Another example of the semiconductor laser device of the present invention will be described in the present embodiment. FIG. 3 shows the structure of the semiconductor laser device of the present embodiment, while FIG. 4A and FIG. 4B show profiles for the P wave and the S wave.

A broad area semiconductor laser device 50 of the present embodiment is an air ridge broad area semiconductor laser device and, as shown in FIG. 3, includes a laminated structure consisting of a 2 µm thick n-$Al_{0.5}Ga_{0.5}As$ first clad layer 54, an active layer 56, which consists of a 30 nm thick $Al_{0.3}Ga_{0.7}As$ optical guide layer and an $Al_{0.1}Ga_{0.9}As$ quantum well layer, a 0.3 µm thick p-$Al_{0.5}Ga_{0.5}As$ lower second clad layer 58, a 15 nm thick $Al_{0.7}Ga_{0.3}As$ etch stop layer 60, a 2 µm thick p-$Al_{0.5}Ga_{0.5}As$ upper second clad layer 62, and a 0.5 µm thick p-GaAs contact layer 64, all of which make up a laminated structure on top of a n-GaAs substrate 52.

The p-$Al_{0.5}Ga_{0.5}As$ upper second clad layer 62 and the p-GaAs contact layer 64 are etched down to the $Al_{0.7}Ga_{0.3}As$ etch stop layer 60 in order to form a stripe shaped ridge 66. On the sides of the ridge 66 are exposed the $Al_{0.7}Ga_{0.3}As$ etch stop layer 60.

Although not shown in the figure, a p side electrode is formed on the p-GaAs contact layer 64 on top of the p-GaAs contact layer 64, while an n side electrode is formed on the back side of the n-GaAs substrate 52.

When the semiconductor laser device 50 is manufactured, a laminated structure consisting of the following films, which are on top of each other, are grown epitaxially with the MOCVD method on the n-GaAs substrate 52: the n-$Al_{0.5}Ga_{0.5}As$ first clad layer 54; the active layer 56 consisting of the $Al_{0.3}Ga_{0.7}As$ optical guide layer and the $Al_{0.1}Ga_{0.9}As$ quantum well layer; the p-$Al_{0.5}Ga_{0.5}As$ lower second clad layer 58; the $Al_{0.7}Ga_{0.3}As$ etch stop layer 60; the p-$Al_{0.5}Ga_{0.5}As$ upper second clad layer 62; and the p-GaAs contact layer 64.

Next, a lithography process is used for forming an $SiO_2$ mask, which is in the shape of a 20 μm wide stripe that covers the current injection region but leaves the current non-injection region exposed, on the p-GaAs contact layer 64.

Next, the p-GaAs contact layer 64 and the p-$Al_{0.5}Ga_{0.5}As$ upper second clad layer 62 in the current non-injection region are etched by a chemical etching method that relies on a mixture of citric acid and hydrogen peroxide as the etchant. The $Al_{0.7}Ga_{0.3}As$ etch stop layer 60 will be exposed as a result, and the stripe shaped ridge 66 will be formed. This chemical etching process can be easily accomplished by selecting an appropriate ratio of citric acid to hydrogen peroxide in the etching solution mixture.

Next, the $SiO_2$ mask is stripped off. Then a p side electrode is formed on top of the p-GaAs contact layer 64, or the n side electrode is formed on the back side of the n-GaAs substrate 52. By the way, an insulating film, which is not shown in the figure, is formed on the sidewalls of the ridge 66 as well as over the $Al_{0.7}Ga_{0.3}As$ etch stop layer 60 on the sides of the ridge 66. Manufacturing of the semiconductor laser device 50 is thus completed.

Using the PBS, the NFP profile of the semiconductor laser device 50 is split into the P wave and the S wave, and the optical intensity distributions in the direction of the width of the laser stripe part 66 are measured. FIG. 4A and FIG. 4B show the resulting profiles.

In the present embodiment, the thickness of the second clad layer in the current non-injection region is 0.3 μm, and the composition of the etch stop layer is $Al_{0.7}Ga_{0.3}As$. As a result, the optical intensity distribution in the NFP profile becomes uniform. As shown in FIG. 4A and FIG. 4B, the profiles for the P wave and the S wave are top hat shaped or are flat in the direction of the width of the laser stripe part 66. The intensity of the optical radiation from the laser stripe part 66 is fairly uniform.

As in the first embodiment, the ratio (B/A)×100, where A is the average optical intensity of the P wave and B is the maximum optical intensity of the S wave, ranges between 8% and 12%, as in the first embodiment.

According to the present invention, in a broad area type AlGaAs semiconductor laser device that is provided with a laminated structure including, on an active layer, a lower second clad layer, a specific compound semiconductor layer and an upper second clad layer, and in which the upper second clad layer is formed as a stripe shaped ridge constituting a current injection region of a width of 20 μm or greater, the composition of the specific compound semiconductor layer is made to be $Al_xGa_{1-x}As$ (0.4≦x≦0.8), and the upper second clad layer is made to function as an etch stop layer upon etching.

Thus, because the composition of the specific compound semiconductor layer does not differ greatly from the composition of the upper and the lower second clad layers, no stress is caused from strain in the specific compound semiconductor layer, and the profiles of the P wave and the S wave become top hat shaped. In addition, because the specific compound semiconductor layer functions as an etch stop layer, ridge formation in the upper second clad layer is made easier.

Thus, since the invention disclosed herein may be embodied in other specific forms without departing from the spirit or general characteristics thereof, some of which forms have been indicated, the embodiments described herein are to be considered in all respects illustrative and not restrictive. The scope of the invention is to be indicated by the appended claims, rather than by the foregoing description, and all changes which come within the meaning and range of equivalents of the claims are intended to be embraced therein.

What is claimed is:

1. An AlGaAs semiconductor laser device of a multi-layered structure, comprising:
   a first clad layer of a first conductivity type;
   an active layer comprising an optical guide layer and a quantum well layer;
   a lower second clad layer of a second conductivity type;
   a specific compound semiconductor layer having a composition different from that of the lower second clad layer; and
   an upper second clad layer of the same composition as the lower second clad layer, wherein
   said layers are formed on top of a substrate in order of mention;
   the upper second clad layer comprises a stripe shaped ridge that has a width of greater than or equal to 20 μm and forms a current injection region,
   the specific compound semiconductor layer is $Al_xGa_{1-x}As$ (0.4≦x≦0.8) and functions as an etch stop layer in etching the upper second clad layer; and
   a ratio of (B/A)×100 ranges between 8 and 12 percent, where B is the average optical intensity of a p-polarized component of a wave emitted from said semiconductor laser device and A is the maximum optical intensity of an s-polarized component of said wave.

2. The semiconductor laser device of claim 1, wherein, if the composition of the lower second clad layer is $Al_yGa_{1-y}As$, x in the composition $Al_xGa_{1-x}As$ of the specific compound semiconductor layer is greater than y.

3. The semiconductor laser device of claim 2, wherein the thickness of the lower second clad layer is less than or equal to 0.7 μm.

4. The semiconductor laser device of claim 1, wherein the thickness of the lower second clad layer is less than or equal to 0.7 μm.

5. The semiconductor laser device of claim 1, wherein
   the stripe shaped ridge is formed as an air ridge; or
   side walls of the stripe shaped ridge, as well as the specific compound semiconductor layer on sides of the stripe shaped ridge, are embedded with a compound semiconductor layer of the first conductivity type by selective growth.

6. The semiconductor laser device of claim 2, wherein
the stripe shaped ridge is formed as an air ridge; or
side walls of the stripe shaped ridge, as well as the specific compound semiconductor layer on sides of the stripe shaped ridge, are embedded with a compound semiconductor layer of the first conductivity type by selective growth.

7. The semiconductor laser device of claim 3, wherein
the stripe shaped ridge is formed as an air ridge; or
side walls of the striped shaped ridge, as well as the specific compound semiconductor layer on sides of the stripe shaped ridge, are embedded with a compound semiconductor layer of the first conductivity type by selective growth.

8. The semiconductor laser device of claim 4, wherein
the stripe shaped ridge is formed as an air ridge; or
side walls of the stripe shaped ridge, as well as the specific compound semiconductor layer on sides of the stripe shaped ridge, are embedded with a compound semiconductor layer of the first conductivity type by selective growth.

* * * * *